United States Patent
Ikezaki

(10) Patent No.: US 6,842,001 B2
(45) Date of Patent: Jan. 11, 2005

(54) MRI SYSTEMS WITH PARALLEL RECEIVERS FOR PHASE CORRECTION

(75) Inventor: Yoshikazu Ikezaki, Tokyo (JP)

(73) Assignee: GE Medical Systems Global Technologies Company, LLC, Waukesha, WI (US)

(*) Notice: Subject to any disclaimer, the term of this patent is extended or adjusted under 35 U.S.C. 154(b) by 0 days.

(21) Appl. No.: 10/642,935

(22) Filed: Aug. 18, 2003

(65) Prior Publication Data
US 2004/0039276 A1 Feb. 26, 2004

(30) Foreign Application Priority Data
Aug. 20, 2002 (JP) ........................... 2002-238971

(51) Int. Cl.⁷ .............................................. G01V 3/00
(52) U.S. Cl. ........................ 324/309; 324/307; 324/306
(58) Field of Search ............................... 324/300–322; 600/410, 411, 407

(56) References Cited

U.S. PATENT DOCUMENTS

| | | | |
|---|---|---|---|
| 5,732,701 A | | 3/1998 | Yoshitome et al. |
| 5,910,728 A | * | 6/1999 | Sodickson .................. 324/309 |
| 6,289,232 B1 | * | 9/2001 | Jakob et al. ................. 600/410 |
| 6,377,045 B1 | | 4/2002 | Van Den Brink et al. |
| 6,486,671 B1 | | 11/2002 | King |
| 6,487,435 B2 | | 11/2002 | Mistretta et al. |
| 6,489,764 B2 | | 12/2002 | Yamazaki et al. |
| 6,492,814 B1 | | 12/2002 | Watkins et al. |
| 6,512,372 B1 | | 1/2003 | Ikezaki |
| 6,559,642 B2 | | 5/2003 | King |
| 6,564,082 B2 | | 5/2003 | Zhu |
| 2004/0039276 A1 | * | 2/2004 | Ikezaki ...................... 600/407 |

OTHER PUBLICATIONS

Pruessmann et al.: "Sense: Sensitivity Encoding for Fast MRI," Magnetic Resonance in Medicine 42:952–962 (1999), pp. 952–962.

* cited by examiner

Primary Examiner—Diego Gutierrez
Assistant Examiner—Tiffany A. Fetzner
(74) Attorney, Agent, or Firm—Carl B. Horton, Esq.; Armstrong Teasdale LLP

(57) ABSTRACT

For the purpose of enabling parallel imaging even when a navigator echo is used to phase-correct an imaging echo, the present invention involves: exciting spins within a subject to acquire an imaging echo generated by the excited spins along with a navigator echo, with a reduced field-of-view via a plurality of receiver systems; conducting phase correction on the imaging echo based on the navigator echo; producing an intermediate image based on the phase-corrected imaging echo from each of the plurality of receive systems; generating a sensitivity matrix for the plurality of receiver systems; correcting the phase of matrix data in the sensitivity matrix; and producing an image with a full field-of-view based on the intermediate image and the phase-corrected sensitivity matrix.

17 Claims, 11 Drawing Sheets

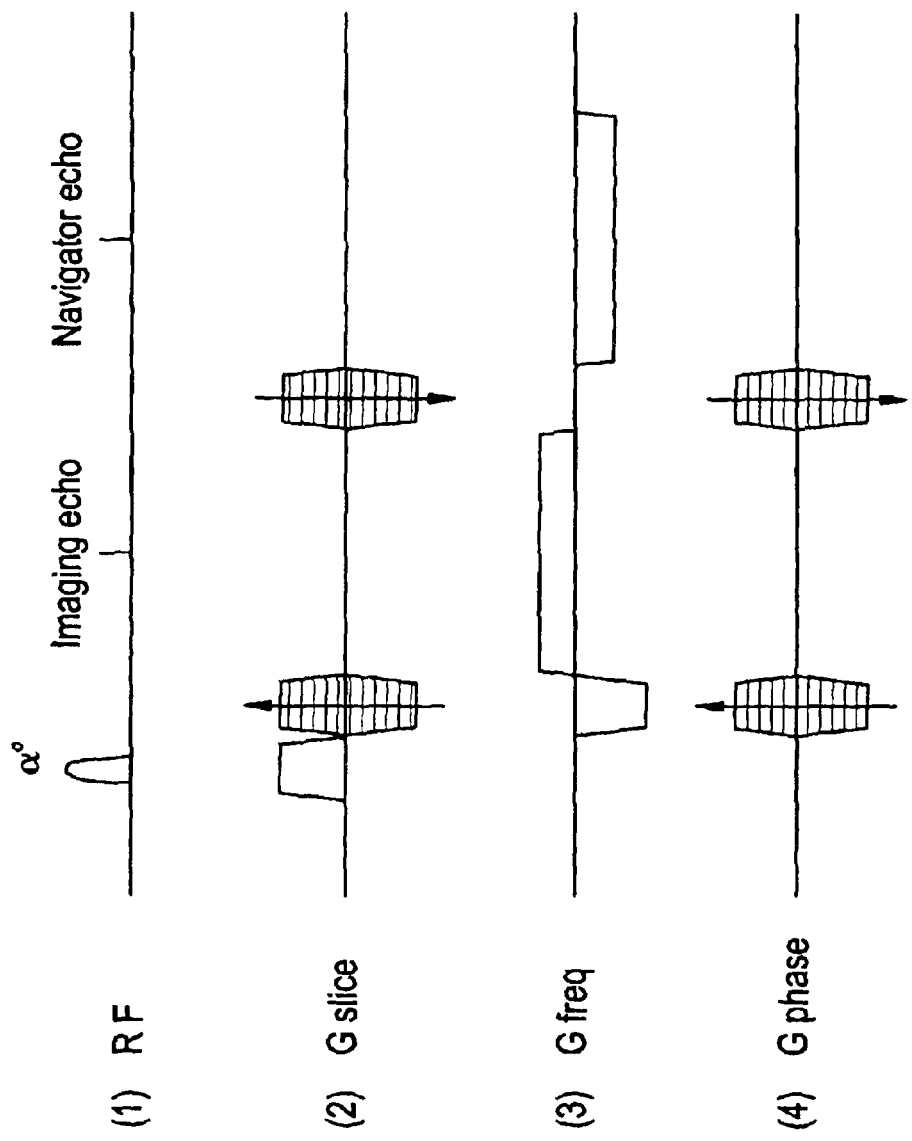

MRI SYSTEMS WITH PARALLEL RECEIVERS FOR PHASE CORRECTION

CROSS REFERENCE TO RELATED APPLICATIONS

This application claims the benefit of Japanese Application No. 2002-238971 filed Aug. 20, 2002.

BACKGROUND OF THE INVENTION

The present invention relates to a magnetic resonance imaging apparatus, and more particularly to a magnetic resonance imaging apparatus that conducts parallel imaging.

In a magnetic resonance imaging (MRI) apparatus, a subject to be imaged is carried into an internal space of a magnet system, i.e., an imaging space in which a static magnetic field is generated, a gradient magnetic field and a radio frequency (RF) magnetic field are applied to excite spins within the subject to thereby generate magnetic resonance signals, and an image is reconstructed based on the received signals.

One scheme of the magnetic resonance imaging is parallel imaging. Parallel imaging is described by, for example, Klaas P. Pruessmann et al. in an article entitled "SENSE: Sensitivity Encoding for Fast MRI", *Magnetic Resonance in Medicine*, 42: 952–962 (1999).

Generally, in parallel imaging, magnetic resonance signals are acquired via a plurality of receiver systems in a simultaneous and parallel manner. The acquisition of the magnetic resonance signals is conducted with a field-of-view (FOV) reduced by half, for example. By reducing the FOV by half, the rate of signal acquisition is doubled.

An image is reconstructed based on the signals thus acquired. The image reconstruction is conducted in two steps. At the first step, an intermediate image is produced based on the signals acquired by the plurality of receiver systems. The image production employs two-dimensional inverse Fourier transformation. The produced image has a reduced FOV. Because the FOV is reduced, aliasing images resulting from wraparound from outside of the FOV are contained in the image.

At the second step, the aliasing images are brought back to their original positions by applying a certain calculation to the image and an image with a whole FOV is produced. The calculation uses the following equation:

$$V=(S^*S)^{-1}S^*A, \quad \text{[Equation 3]}$$

where

V: pixel values of the image with the whole FOV,

S: a sensitivity matrix,

S*: an adjoint matrix of S, and

A: pixel values of the intermediate image.

The sensitivity matrix S is determined by the spatial distribution of the sensitivity of the plurality of receiver systems. The sensitivity of a receiver system generally has a complex form, and data of the sensitivity matrix therefore also has a complex form. Similarly, the pixel values V and A also have a complex form.

One technique for taking a cross-sectional image of the head is MS-DW-EPI (multi-shot diffusion-weighted echo planar imaging). The technique involves capturing a cross-sectional image to which a weight is applied such that spins with less diffusion have a larger signal intensity, by a multi-shot (MS) echo planar imaging (EPI) technique. The captured cross-sectional image is suitable for diagnosing the presence of cerebral infarction.

In the multi-shot echo planar imaging technique, the collection of imaging echoes filling one screen image is spread over a plurality of times. Specifically, the spins are excited a plurality of number of times, and a certain number of imaging echoes are collected during each excitation.

If positional shifting of the spins occurs between the excitations due to pulsation of the brain in such a process, a phase error between the imaging echoes leads to ghosts generated in the reconstructed image. To avoid this, a navigator echo is collected for each excitation, and the phase of the navigator echo is used to correct the phase of the imaging echoes.

Parallel imaging according to he MS-DW-EPI technique has not been conducted. This is because when the imaging echoes are phase-corrected by the navigator echo, the phase originating from the sensitivity of the receiver systems is unnecessarily corrected, resulting in inconsistency with the sensitivity matrix.

SUMMARY OF THE INVENTION

It is therefore an object of the present invention to provide a magnetic resonance imaging apparatus that enables parallel imaging even when a navigator echo is used to phase-correct an imaging echo.

The present invention, for solving the aforementioned problem, is a magnetic resonance imaging apparatus characterized in comprising: acquiring means for exciting spins within a subject to acquire an imaging echo generated by the excited spins along with a navigator echo, with a reduced field-of-view via a plurality of receiver systems; first correcting means for conducting phase correction on said imaging echo based on said navigator echo; first image producing means for producing an intermediate image based on said phase-corrected imaging echo from each of said plurality of receiver systems; generating means for generating a sensitivity matrix for said plurality of receiver systems; second correcting means for phase-correcting matrix data in said sensitivity matrix; and second image producing means for producing an image with a full field-of-view based on said intermediate image and said phase-corrected sensitivity matrix.

Moreover, the invention for solving the aforementioned problem may be a magnetic resonance imaging method characterized in comprising: exciting spins within a subject to acquire an imaging echo generated by the excited spins along with a navigator echo, with a reduced field-of-view via a plurality of receiver systems; conducting phase correction on said imaging echo based on said navigator echo; producing an intermediate image based on said phase-corrected imaging echo from each of said plurality of receiver systems; generating a sensitivity matrix for said plurality of receiver systems; phase-correcting matrix data in said sensitivity matrix; and producing an image with a full field-of-view based on said intermediate image and said phase-corrected sensitivity matrix.

In the present invention, matrix data in a sensitivity matrix are phase-corrected, and therefore, inconsistency with an imaging echo that is phase-corrected using a navigator echo is eliminated and an image can be correctly produced.

The reduction factor for the reduced field-of-view preferably satisfies the following requirement so that a proper image may be obtained:

$$n \geq R > 1, \quad \text{[Equation 4]}$$

where
R: the reduction factor, and
n: the number of receiver systems.

The acquiring means preferably implements the reduced field-of-view by enlargement of sampling intervals for a k-space so that the reduction of the field-of-view may be properly achieved.

The acquiring means preferably implements the enlargement of the sampling intervals by enlargement of a step difference of phase encoding when the field-of-view is to be reduced in the phase encoding direction.

The plurality of receiver systems preferably have respective receiving coils so that the reception may be done in a simultaneous and parallel manner.

The receiving coils are preferably surface coils so that the reception may be conducted close to the subject.

The acquiring means preferably employs an MS-DW-EPI technique in acquiring the imaging echo when an image incorporating diffusion is to be captured.

The acquiring means preferably employs a technique other than the MS-DW-EPI technique in acquiring the imaging echo when an image other than that incorporating diffusion is to be captured.

The generating means preferably generates the sensitivity matrix based on a spatial distribution of reception sensitivity of the plurality of receiver systems with respect to the full field-of-view so that the sensitivity matrix may be properly generated.

The generating means preferably generates the sensitivity matrix after fitting the spatial distribution of the magnitude of the reception sensitivity of each of the plurality of receiver systems to a two-dimensional polynomial so that the sensitivity matrix may be still more properly generated.

The generating means preferably conducts the fitting by a method of least squares weighted depending upon the magnitude of the reception sensitivity so that the fitting may be properly achieved.

A weight for the weighting is preferably the square of the magnitude of the reception sensitivity so that the fitting may be still more properly achieved.

The two-dimensional polynomial is preferably a quadratic so that the fitting may be simplified.

The second correcting means preferably homogenizes the phase so that consistency with the phase correction on the imaging echo may be improved. The phase may be zero or a constant value other than zero.

The second image producing means preferably employs the following equation in producing the image so that an image with a full field-of-view may be properly obtained:

$$V = (S^*S)^{-1} S^* A, \qquad \text{[Equation 5]}$$

where
V: pixel values of the image with the full FOV,
S: a sensitivity matrix,
S*: an adjoint matrix of S, and
A: pixel values of the intermediate image.

Therefore, the present invention provides a magnetic resonance imaging apparatus that enables parallel imaging even when a navigator echo is used to phase-correct an imaging echo.

Further objects and advantages of the present invention will be apparent from the following description of the preferred embodiments of the invention as illustrated in the accompanying drawings.

BRIEF DESCRIPTION OF THE DRAWINGS

FIG. 13 shows an exemplary pulse sequence executed by the apparatus in accordance with one embodiment of the present invention.

DETAILED DESCRIPTION OF THE INVENTION

Figure 1:
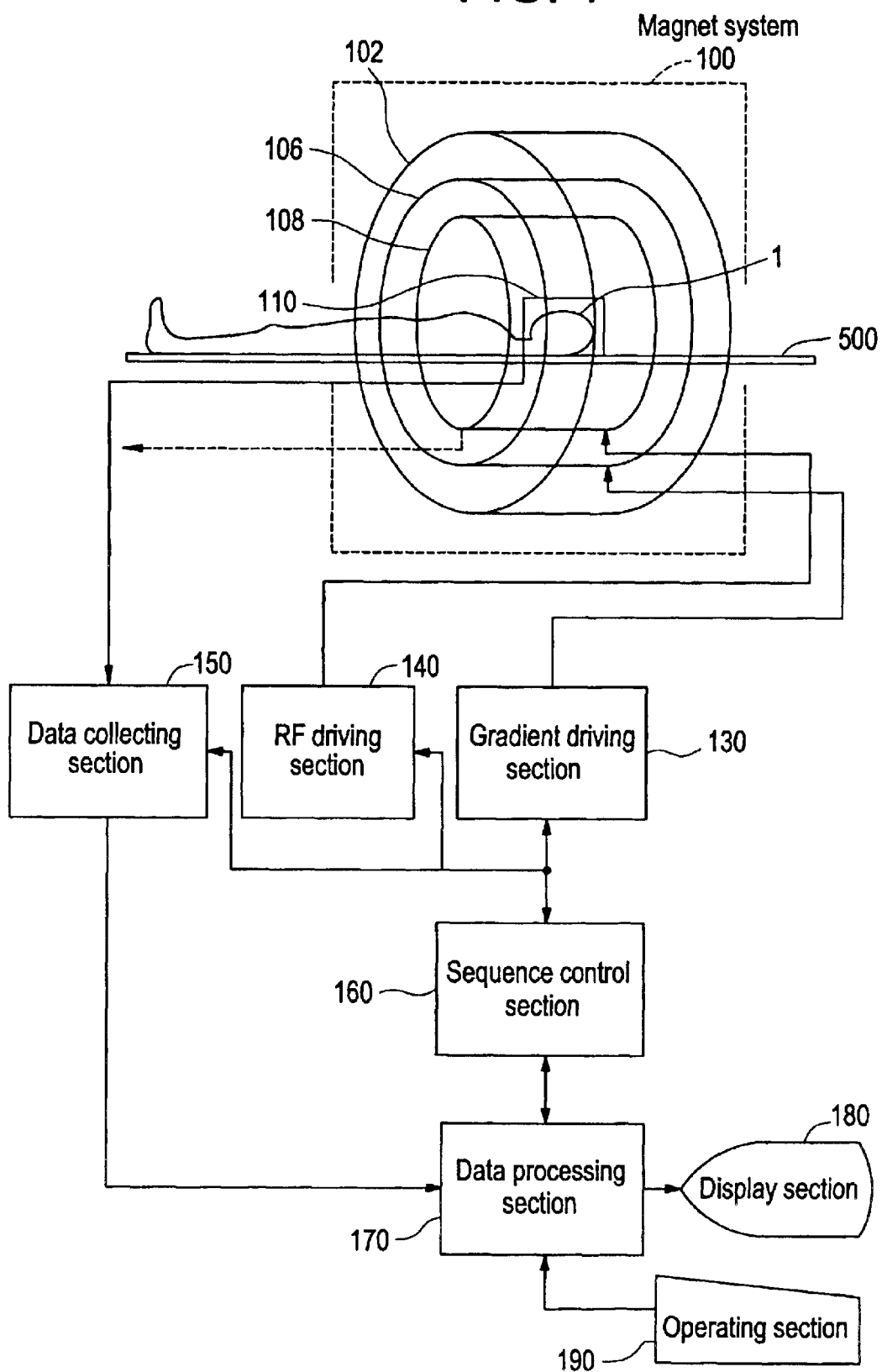
FIG. 1 is a block diagram of an apparatus in accordance with one embodiment of the present invention.

Embodiments of the present invention will now be described in detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention.

As shown in FIG. 1, the present apparatus has a magnet system 100. The magnet system 100 has a main magnetic field coil section 102, a gradient coil section 106, and an RF coil section 108. These coil sections have a generally cylindrical shape and are concentrically disposed. A subject to be imaged 1 is rested on a cradle 500 and carried into and out of a generally cylindrical internal space (bore) of the magnet system 100 by carrier means, which is not shown.

The head of the subject 1 is fitted with a receiving coil section 110. The receiving coil section 110 has a plurality of receiving coils. The receiving coil section 110 will be described in detail later.

The main magnetic field coil section 102 generates a static magnetic field in the internal space of the magnet system 100. The direction of the static magnetic field is generally in parallel with the direction of the body axis of the subject 1. That is, a magnetic field commonly referred to as a horizontal magnetic field is generated. The main magnetic field coil section 102 is made using a superconductive coil, for example. However, the main magnetic field coil section 102 is not limited to the superconductive coil, but may be made using a normal conductive coil or the like.

The gradient coil section 106 generates three gradient magnetic fields for imparting gradients to the static magnetic field strength in directions of three mutually perpendicular axes, i.e., a slice axis, a phase axis, and a frequency axis.

When mutually perpendicular coordinate axes in the static magnetic field space are represented as X, Y, and Z, any one of the axes may be the slice axis. In this case, one of the two remaining axes is the phase axis and the other is the frequency axis. Moreover, the slice, phase, and frequency axes can be given arbitrary inclination with respect to the X-, Y-, and Z-axes while maintaining their mutual perpendicularity. In the present apparatus, the direction of the body axis of the subject 1 is defined as the Z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. The readout gradient magnetic field is synonymous with the frequency encoding gradient magnetic field. In order to enable generation of such gradient magnetic fields, the gradient coil section 106 has three gradient coils, which are not shown. The gradient magnetic field will be sometimes referred to simply as the gradient hereinbelow.

The RF coil section 108 generates a radio frequency magnetic field in the static magnetic field space for exciting spins within the subject 1. The generation of the radio frequency magnetic field will be sometimes referred to as transmission of an RF excitation signal hereinbelow. Moreover, the RF excitation signal will be sometimes referred to as the RF pulse.

Electromagnetic waves, i.e., magnetic resonance signals, generated by the excited spins are received by the receiving coil section 110. The magnetic resonance signals can also be received by the RF coil section 108.

The magnetic resonance signals are those in a frequency domain, i.e., in a Fourier space. Since the magnetic resonance signals are encoded in two axes by the gradients in the phase- and frequency-axis directions, the magnetic resonance signals are obtained as signals in a two-dimensional Fourier space. The phase encoding gradient and readout gradient are used to determine a position at which a signal is sampled in the two-dimensional Fourier space. The two-dimensional Fourier space will be sometimes referred to as the k-space hereinbelow.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The RF coil section 108 is connected with an RF driving section 140. The RF driving section 140 supplies driving signals to the RF coil section 108 to transmit the RF pulse, thereby exciting the spins within the subject 1.

The receiving coil section 110 is connected with a data collecting section 150. The data collecting section 150 collects signals received by the receiving coil section 110 as digital data. The RF coil section 108 can also be connected to the data collecting section 150 to allow collection of signals received by the RF coil section 108.

The gradient driving section 130, RF driving section 140 and data collecting section 150 are connected with a sequence control section 160. The sequence control section 160 controls the gradient driving section 130, RF driving section 140 and data collecting section 150 to carry out the collection of magnetic resonance signals.

The sequence control section 160 is, for example, constituted using a computer. The sequence control section 160 has a memory, which is not shown. The memory stores programs for the sequence control section 160 and several kinds of data. The function of the sequence control section 160 is implemented by the computer executing a program stored in the memory.

The output of the data collecting section 150 is connected to a data processing section 170. Data collected by the data collecting section 150 are input to the data processing section 170. The data processing section 170 is, for example, constituted using a computer. The data processing section 170 has a memory, which is not shown. The memory stores programs for the data processing section 170 and several kinds of data.

The data processing section 170 is connected to the sequence control section 160. The data processing section 170 is above the sequence control section 160 and controls it. The function of the present apparatus is implemented by the data processing section 170 executing a program stored in the memory.

The data processing section 170 stores the data collected by the data collecting section 150 into the memory. A data space is established in the memory. The data space corresponds to the k-space. The data processing section 170 performs two-dimensional inverse Fourier transformation on the data in the k-space to reconstruct an image.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image output from the data processing section 170 and several kinds of information. The operating section 190 is operated by a user, and the section 190 inputs several commands, information and so forth to the data processing section 170. The user interactively operates the present apparatus via the display section 180 and operating section 190.

Figure 2:
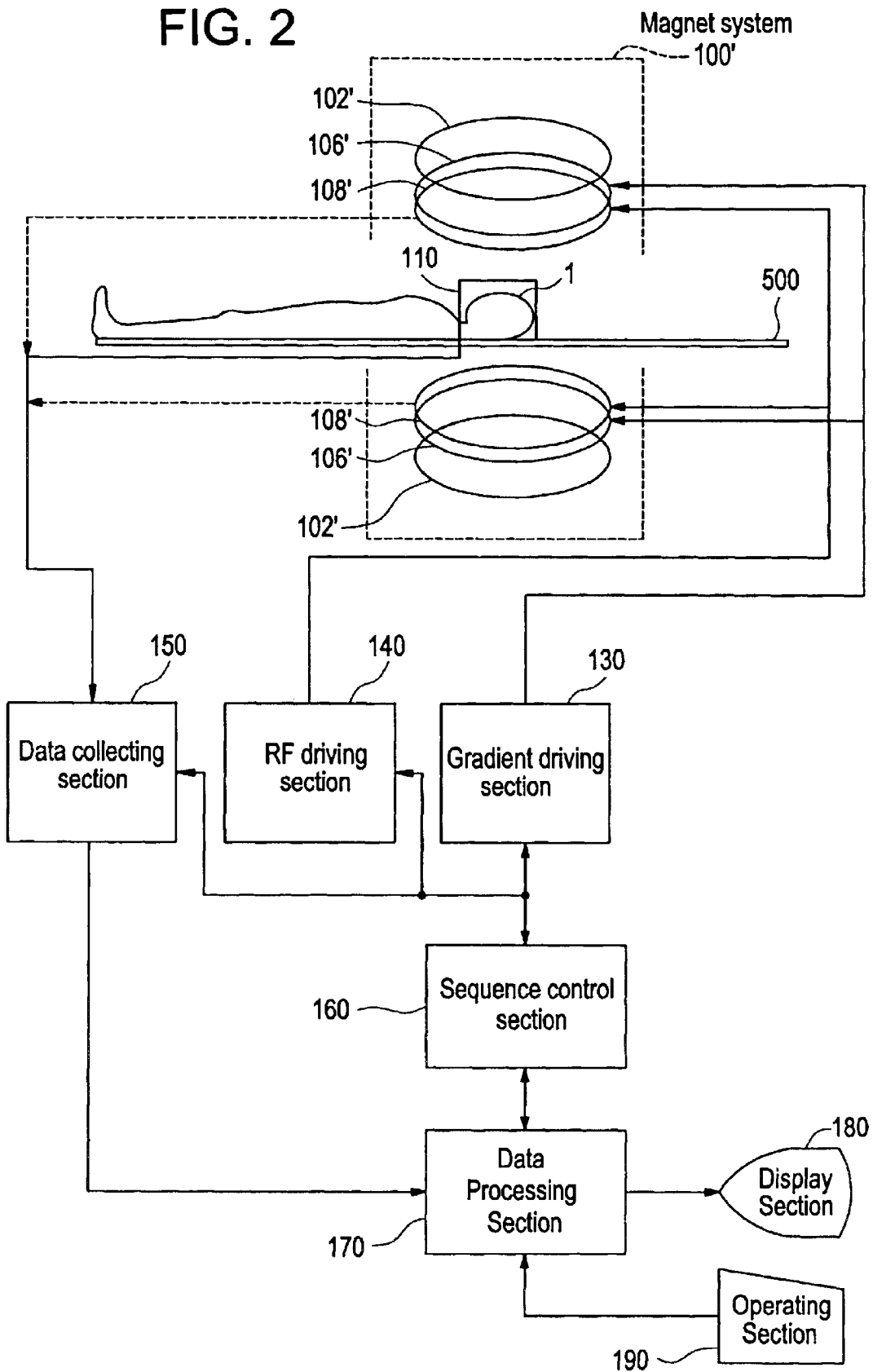
FIG. 2 is a block diagram of an apparatus in accordance with one embodiment of the present invention.

FIG. 2 shows a block diagram of a magnetic resonance imaging apparatus of another type, which is one embodiment of the present invention. The configuration of the apparatus represents an embodiment of the apparatus in accordance with the present invention.

The present apparatus has a magnet system 100' of a type different from that of the apparatus shown in FIG. 1. Since the apparatus has a configuration similar to that of the apparatus shown in FIG. 1 except for the magnet system 100', similar portions are designated by similar reference numerals and the explanation thereof will be omitted.

The magnet system 100' has a main magnetic field magnet section 102', a gradient coil section 106', and an RF coil section 108'. The main magnetic field magnet section 102' and the coil sections each include a pair of members facing each other across a space. These sections have a generally disk-like shape and are disposed to have a common center axis. A subject 1 is rested on a cradle 500 and carried into and out of an internal space (bore) of the magnet system 100' by a carrier means, which is not shown.

The head of the subject 1 is fitted with a receiving coil section 110. The receiving coil section 110 has a plurality of receiving coils. The receiving coil section 110 will be described in detail later.

The main magnetic field magnet section 102' generates a static magnetic field in the internal space of the magnet system 100'. The direction of the static magnetic field is generally orthogonal to the direction of the body axis of the subject 1. That is, a magnetic field commonly referred to as a vertical magnetic field is generated. The main magnetic field magnet section 102' is made using a permanent magnet, for example. However, the main magnetic field magnet section 102' is not limited to a permanent magnet, but may be made using a super or normal conductive electromagnet or the like.

The gradient coil section 106' generates three gradient magnetic fields for imparting gradients to the static magnetic field strength in directions of three mutually perpendicular axes, i.e., a slice axis, a phase axis and a frequency axis.

When mutually perpendicular coordinate axes in the static magnetic field space are represented as X, Y, and Z, any one of the axes may be the slice axis. In this case, one of the two remaining axes is the phase axis and the other is the frequency axis. Moreover, the slice, phase, and frequency axes can be given arbitrary inclination with respect to the X-, Y-, and Z-axes while maintaining their mutual perpendicularity. In the present apparatus, the direction of the body axis of the subject 1 is again defined as the Z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. The readout gradient magnetic field is synonymous with the frequency encoding gradient magnetic field. In order to enable generation of such gradient magnetic fields, the gradient coil section 106' has three gradient coils, which are not shown.

The RF coil section 108' transmits an RF pulse to the static magnetic field space for exciting spins within the subject 1. Electromagnetic waves, i.e., magnetic resonance signals, generated by the excited spins are received by the receiving coil section 110. The magnetic resonance signals can also be received by the RF coil section 108'. The signals received by the receiving coil section 110 or RF coil section 108' are input to the data collecting section 150.

Figure 3:
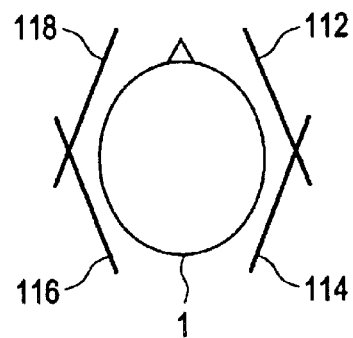
FIG. 3 shows a plurality of receiving coils.

The receiving coil section 110 will now be described. The receiving coil section 110 has a plurality of receiving coils 112–118 disposed close to the head of the subject 1 as shown in FIG. 3. Each receiving coil 112–118 forms a closed loop. The receiving coils 112–118 are disposed surrounding the head of the subject 1. For the receiving coils 112–118, surface coils are employed, for example. The surface coils are suitable for receiving signals very close to the subject.

The receiving coils 112–118 are configured so that mutual interference is substantially prevented. A plurality of receiving coils having no mutual interference are sometimes referred to collectively as a phased-array coil. The number of receiving coils constituting the phased-array coil may be any plural number greater or smaller than four. The following description will be made on a case in which the number of receiving coils is four but also applies to a case in which the number of receiving coils is a plural number greater or smaller than four.

Figure 4:
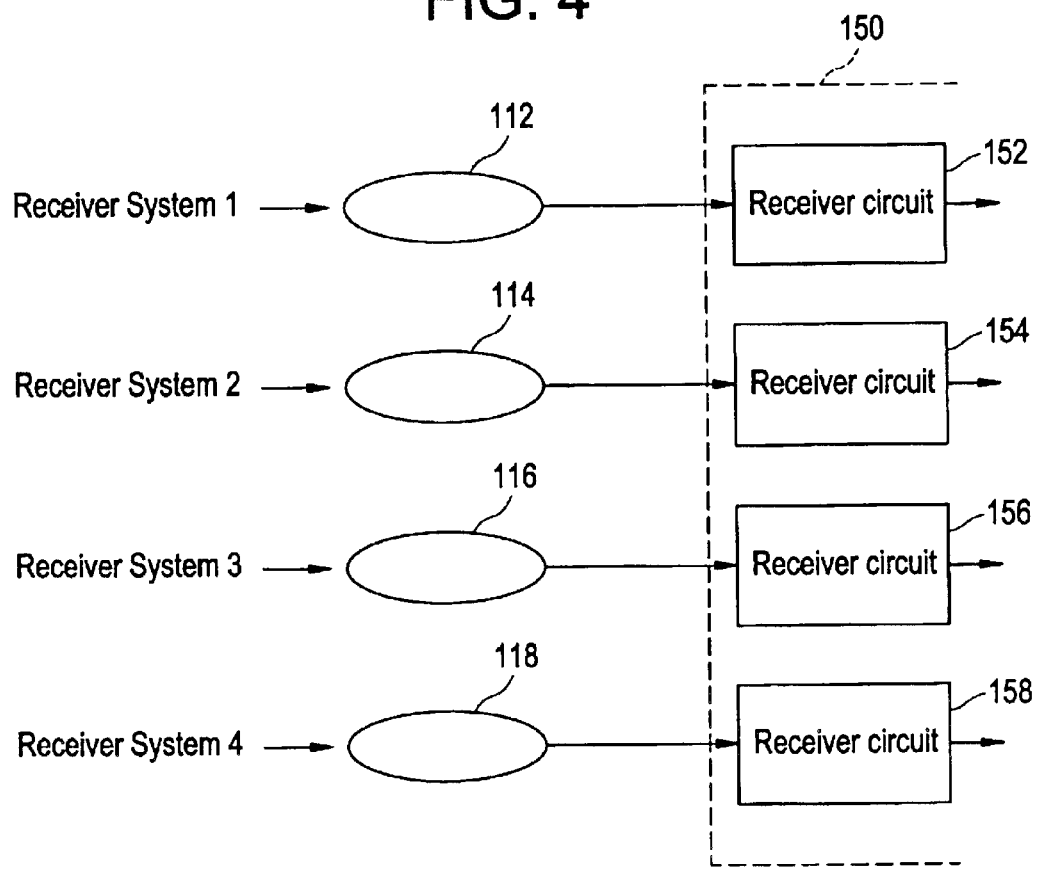
FIG. 4 shows a plurality of receiver systems.

The receiving coils 112–118 constituting a phased-array coil separately receive respective magnetic resonance signals. The signals received by the receiving coils 112–118 are input to receiver circuits 152–158 in the data collecting section 150 as shown in FIG. 4.

The receiving coil 112 and receiver circuit 152 constitute a receiver system 1. The receiving coil 114 and receiver circuit 154 constitute a receiver system 2. The receiving coil 116 and receiver circuit 156 constitute a receiver system 3. The receiving coil 118 and receiver circuit 158 constitute a receiver system 4.

By such a plurality of receiver systems having separate receiving coils, signals can be received by the plurality of receiver systems in a simultaneous and parallel manner. The receiver systems 1–4 represent an embodiment of the plurality of receiver systems in accordance with the present invention.

Figure 5:
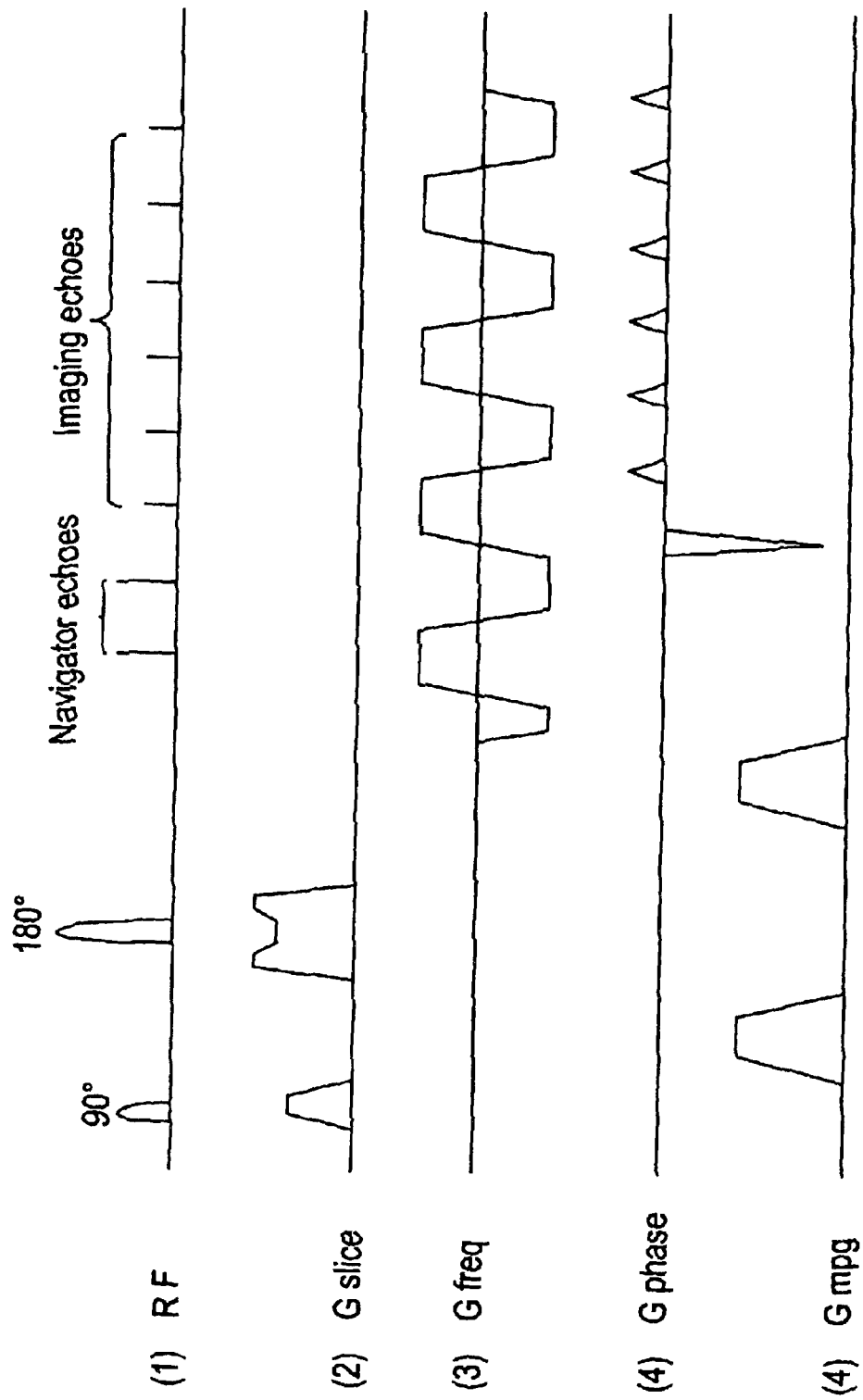
FIG. 5 shows an exemplary pulse sequence executed by the apparatus in accordance with one embodiment of the present invention.

FIG. 5 shows a pulse sequence of a scan according to the MS-DW-EPI technique. The pulse sequence proceeds from the left to the right. The same applies in the following description. In FIG. 5, (1) shows a pulse sequence of RF signals. (2)–(5) show pulse sequences of gradient magnetic fields. (2) represents a slice gradient, (3) represents a frequency encoding gradient, (4) represents a phase encoding gradient, and (5) represents a motion probing gradient. It should be noted that the static magnetic field is constantly applied at a fixed magnetic field strength.

First, spin excitation is effected by a 90° pulse. After a certain time period from the 90° excitation, 180° excitation is effected by a 180° pulse. These are selective excitations under a slice gradient $G_{slice}$. Before and after the 180° excitation, a motion probing gradient $G_{mpg}$ is applied. This applies weighting depending upon diffusion of spins to a magnetic resonance signal.

Next, a frequency encoding gradient $G_{freq}$ is solely applied to read a navigator echo. A pair of the navigator echoes are read. Each navigator echo is represented by its central echo. The same applies in the following description.

Next, a phase encoding gradient $G_{phase}$ and a frequency encoding gradient $G_{freq}$ are applied in a predefined sequence and a plurality of imaging echoes are sequentially read. The plurality of imaging echoes have different phase encodings. Again, each imaging echo is represented by its central echo. The same applies in the following description.

Such a pulse sequence is repeated a predetermined number of times in a cycle of a repetition time TR, and a pair of navigator echoes and a plurality of imaging echoes are read for each repetition. That is, a multi-shot scan is performed. The phase encoding for the imaging echo is changed for each repetition, and imaging echoes filling one screen image are acquired in the predetermined number of times of repetitions.

The imaging echoes in each repetition are phase-corrected by a navigator echo in the same repetition. This removes any phase error due to pulsation of the brain from the imaging echoes.

Figure 6:
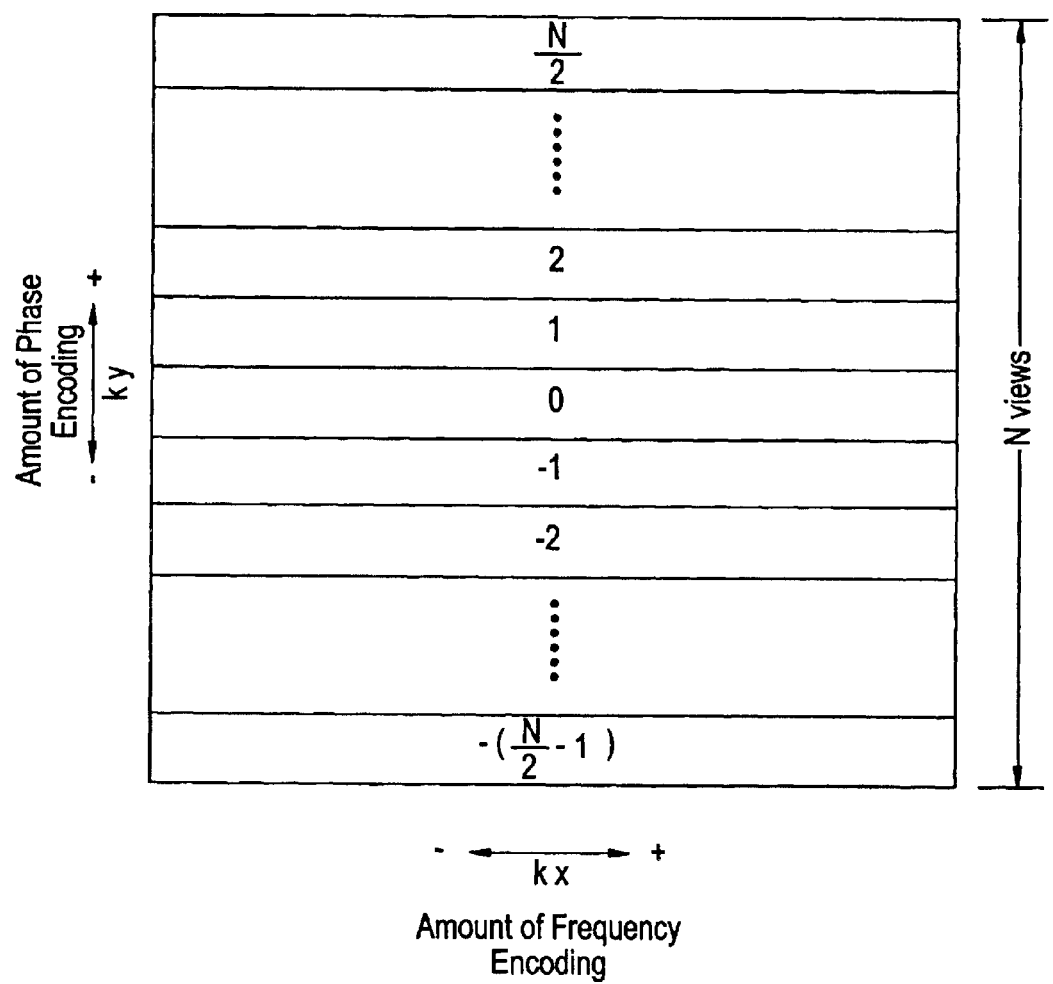
FIG. 6 shows a k-space.

By reading the imaging echoes with the phase and frequency encodings, data in a k-space are sampled. FIG. 6 shows a conceptual diagram of the k-space. As shown, the horizontal axis kx of the k-space is a frequency axis and the vertical axis ky is a phase axis.

In FIG. 6, each of a plurality of laterally extending rectangles represents a data sampling position on the phase axis. The number shown in each rectangle represents the amount of phase encoding. The amounts of phase encoding are normalized by $\pi/N$. N is the number of times of sampling in the phase axis direction.

The amount of phase encoding is zero at the center of the phase axis ky. The amount of phase encoding increases from the center to both ends. The polarities of the increases are opposite to each other. The sampling interval, i.e., the step difference between the amounts of phase encoding is $\pi/N$. By performing two-dimensional inverse Fourier transformation on the data in such a k-space, a cross-sectional image is reconstructed. The reconstructed image represents a whole field-of-view (FOV). The whole FOV will be sometimes referred to as the full FOV hereinbelow.

In parallel imaging, the sampling intervals for the k-space are increased to reduce the number of times of sampling for improving the speed of imaging. Specifically, sampling in the phase axis ky direction is conducted in an alternate manner, for example, to reduce the number of times of sampling by half as indicated by hatching shown in FIG. 7.

This reduces the imaging time by half, thereby improving the speed of imaging.

By the alternate sampling, the sampling intervals are doubled. By doubling the sampling intervals, the FOV of the reconstructed image is reduced by half as compared with the full FOV.

The doubling of the sampling intervals in the phase encoding direction is achieved by setting the step difference between the amounts of phase encoding to $2\pi/N$. This reduces the FOV by half in the phase encoding direction.

Figure 7:
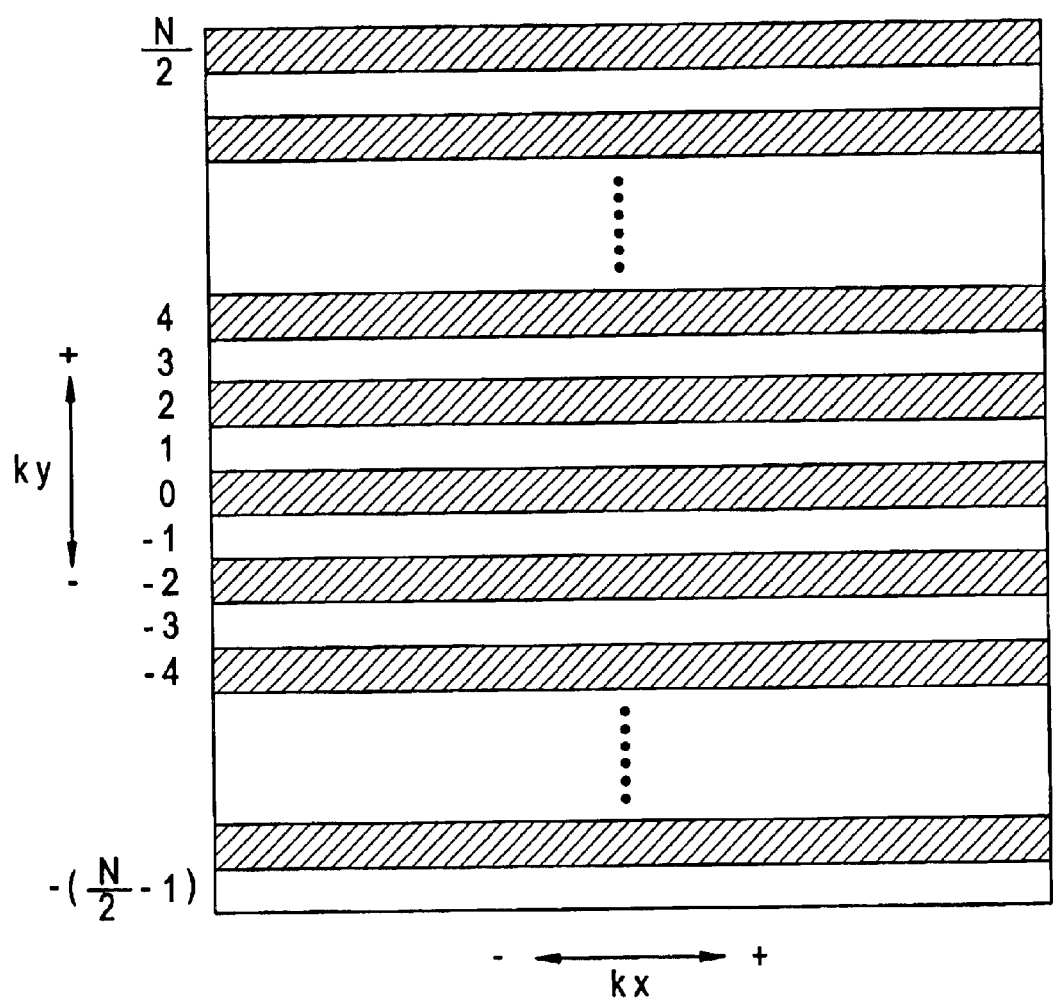
FIG. 7 shows a k-space.

Generally, when the sampling interval, or the step difference between the amounts of phase encoding, is increased by a factor of R, the FOV is reduced by a factor of R. R is sometimes referred to as a reduction factor. In FIG. 7, R=2.

When the number of receiver systems is n, the reduction factor R preferably satisfies the following relationship so that an output image with a full FOV as described later may be properly obtained:

$$n \geq R > 1 \qquad \text{[Equation 6]}$$

where

R: the reduction factor, and n: the number of receiver systems.

Figure 8:
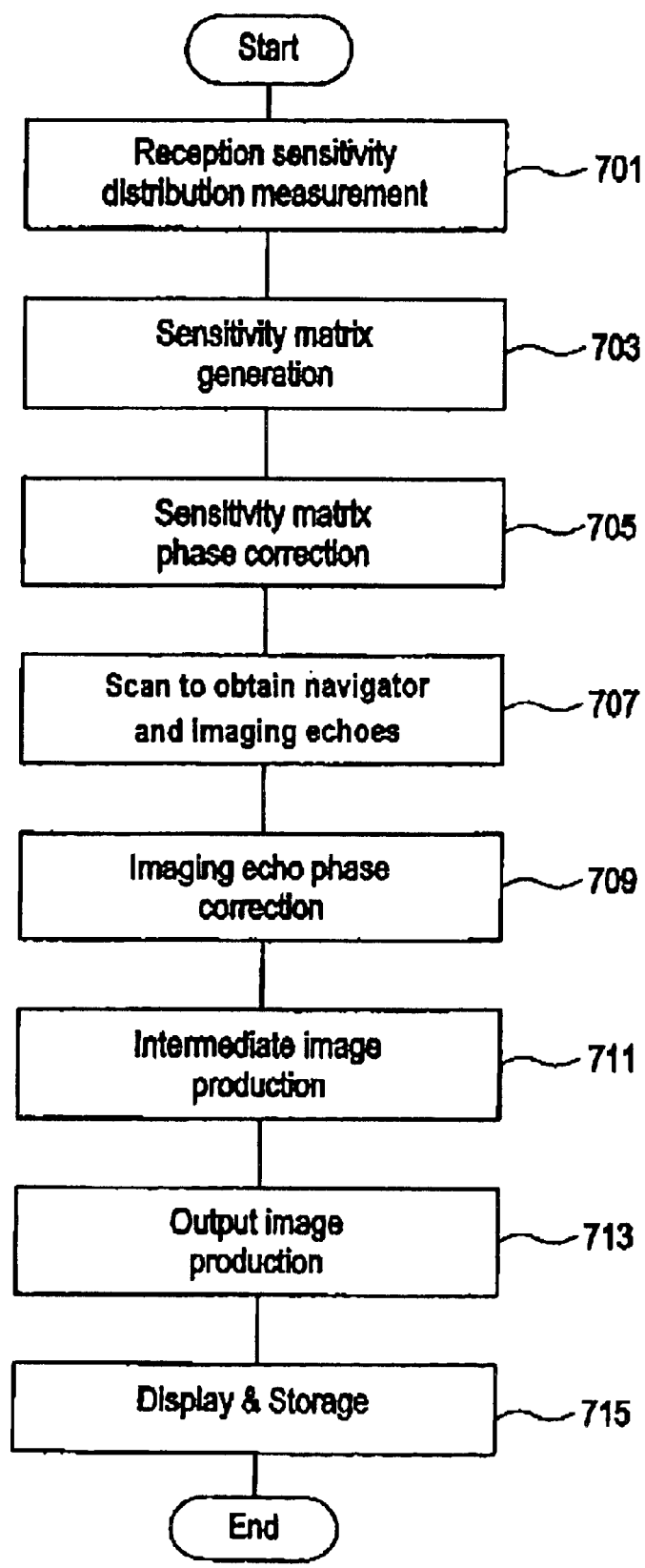
FIG. 8 is a flow chart of an operation of the apparatus in accordance with one embodiment of the present invention.

The operation of the present apparatus will now be described. FIG. 8 shows a flow chart of the operation of the present apparatus. As shown, at Step 701, reception sensitivity distribution measurement is conducted. At this step, the spatial distribution of the sensitivity of the plurality of receiver systems is measured.

The spatial distribution of the sensitivity of the receiver systems is obtained as sensitivity map images. The sensitivity map images are produced from images obtained by scanning the same slice through the subject 1 using the RF coil section 108 (108') and receiving coil section 110, for example.

Specifically, an image captured using the RF coil section 108 (108') is defined as a reference, images captured using the receiving coils 112–118 are defined as measured images, and the sensitivity maps are generated by, for example, calculating the ratio of the measured images and reference image on a pixel-by-pixel basis. The reference image and measured images are captured by scanning of a full FOV. Thus, the sensitivity map images are obtained for the receiving coils 112–118 with a full FOV. Such scanning is sometimes referred to as a calibration scan.

Next, at Step 703, sensitivity matrix generation is conducted. The sensitivity matrix is generated based on the sensitivity map image of each receiving coil. Since the sensitivity map images are obtained with the full FOV, the sensitivity matrix can be properly generated. The sensitivity map image will be sometimes referred to simply as the sensitivity map hereinbelow.

The sensitivity matrix is an n×R matrix. The symbol n designates the number of receiver systems, and R designates the reduction factor. When n=4 and R=2, the sensitivity matrix S is as follows:

$$S = \begin{vmatrix} s_{11} & s_{12} \\ s_{21} & s_{22} \\ s_{31} & s_{32} \\ s_{41} & s_{42} \end{vmatrix}. \qquad \text{[Equation 7]}$$

In the sensitivity matrix S, s11, s21, s31 and s41 designate values of the same pixel in the sensitivity map images of the receiving coils 112, 114, 116 and 118. Values of a pixel in the sensitivity maps that lies at a distance of ½ FOV from the former pixel in the phase encoding direction are designated by s12, s22, s32 and s42. These values are complex.

Next, at Step 705, sensitivity matrix phase correction is conducted. The phase correction is achieved by setting the phase of complex data s in the sensitivity matrix S to zero or a predetermined constant value. Specifically, when the complex data's is defined as:

$$s = Me^{-i\theta}, \qquad \text{[Equation 8]}$$

the phase is defined as follows:

$$\theta = 0, \qquad \text{[Equation 9]}$$

or $$\theta = \text{const}(\neq 0). \qquad \text{[Equation 10]}$$

Next, at Step 707, a scan is conducted. The scan is conducted according to the MS-DW-EPI technique. The scan according to the MS-DW-EPI technique is conducted on a reduced FOV by increasing the sampling intervals for the k-space. The reduced FOV is, for example, a ½ FOV. The reduction factor R is not limited to ½ but may be any appropriate value. The navigators echo and imaging echoes are received via the plurality of receiver systems 1–4 in a simultaneous and parallel manner.

Next, at Step 709, phase correction on the imaging echoes is conducted. The phase correction is achieved by phase-correcting the imaging echoes by the navigator echo for each shot of multi shots.

Next, at Step 711, intermediate image production is conducted. An intermediate image is produced by performing two-dimensional inverse Fourier transformation on the phase-corrected imaging echoes of the plurality of receiver systems. The intermediate image contains aliasing images because it has a reduced FOV.

Next, at Step 713, output image production is conducted. The output image is produced by a calculation using the intermediate image and sensitivity matrix. The output image production uses the following equation. The equation is similar to that described in the article cited earlier.

$$V = (S^*S)^{-1}S^*A, \qquad \text{[Equation 11]}$$

where

V: pixel values of the image with a full FOV,

S: a sensitivity matrix,

S*: an adjoint matrix of S, and

A: pixel values of the intermediate image.

Although the pixel values A in the intermediate image are values after phase-correction in this equation, the calculation can be carried out without inconsistency because the sensitivity matrix S is also phase-corrected. Thus, a cross-sectional image in which the aliasing images are rearranged to their original positions can be obtained with a full FOV.

The cross-sectional image is displayed and stored at Step 715. The display of the cross-sectional image is executed by the display section 180, and the storage thereof is directed to the memory in the data processing section 170.

Figure 9:
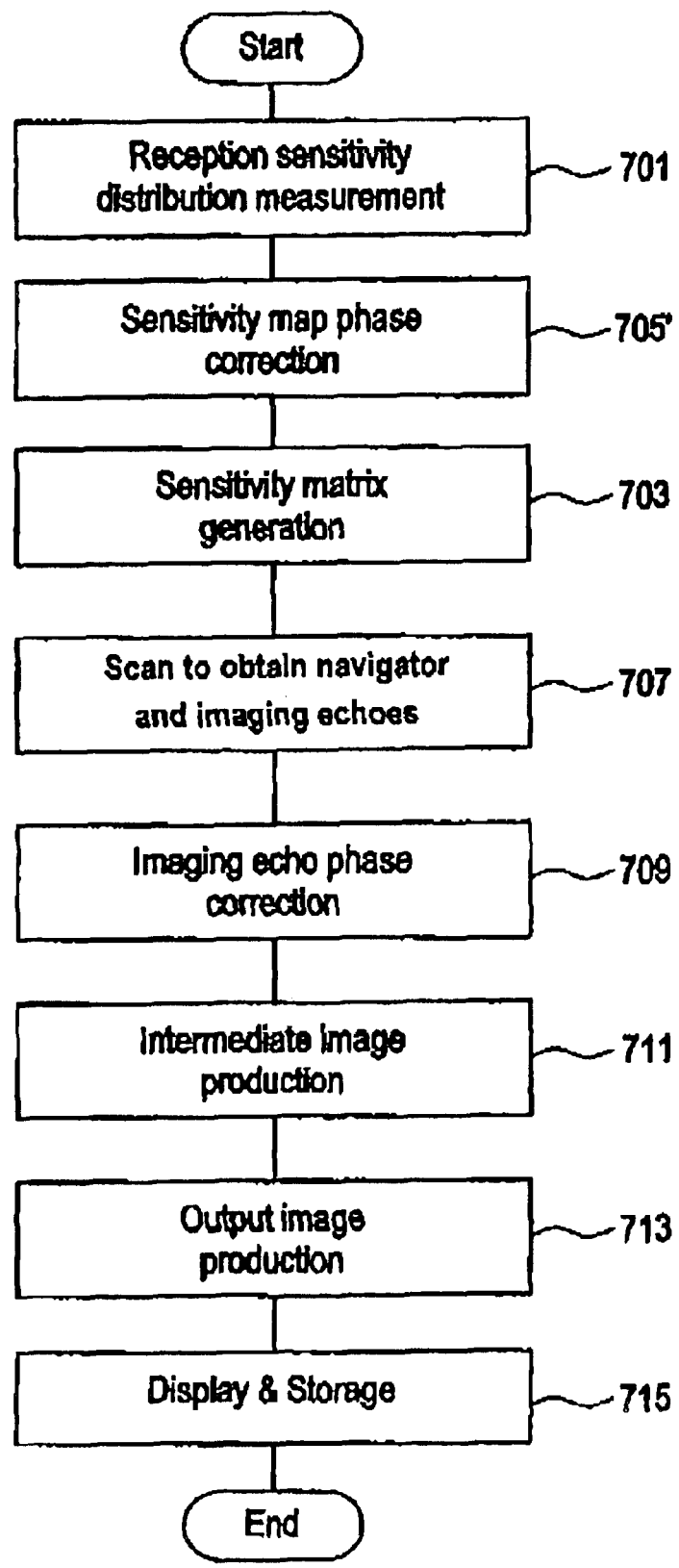
FIG. 9 is a flow chart of an operation of the apparatus in accordance with one embodiment of the present invention.

Moreover, the phase correction may be conducted on the sensitivity maps because the data in the sensitivity matrix are exactly the data of the sensitivity maps. The flow chart in this case is shown in FIG. 9. FIG. 9 is different from that shown in FIG. 8 only in Step 705'.

As shown in FIG. 9, the phase correction is conducted on the sensitivity maps at Step 705', and the sensitivity matrix is generated based on the phase-corrected sensitivity maps at Step 703. The sensitivity matrix thus generated has the corrected phase. That is, the phase correction on the sensitivity matrix is achieved in effect.

Figure 10:
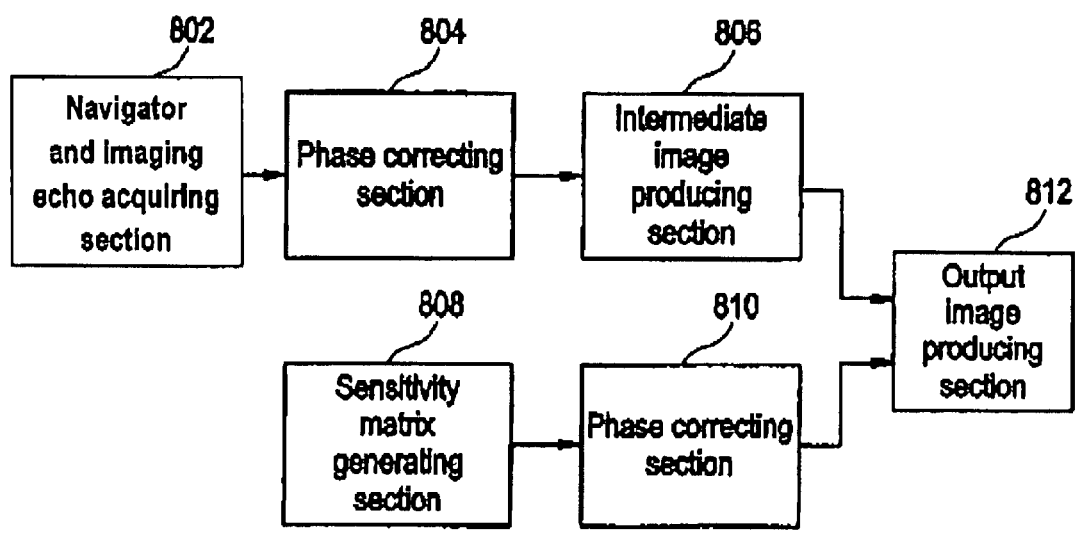
FIG. 10 is a functional block diagram of the apparatus in accordance with one embodiment of the present invention.

FIG. 10 shows a functional block diagram of the present apparatus for the above-described operation. As shown, the apparatus comprises a navigator and imaging echo acquiring section 802, a phase correcting section 804, an intermediate image producing section 806, a sensitivity matrix generating section 808, a phase correcting section 810 and an output image producing section 812.

The navigator and imaging echo acquiring section 802 acquires navigator echoes and imaging echoes. The echoes are acquired according to e MS-DW-EPI technique with a reduced FOV, The navigator and imaging echo acquiring section section 802 corresponds to the function of the present apparatus described at Step 707 shown in FIG. 8. The navigator and imaging echo acquiring section 802 is an embodiment of the acquiring means of the present invention.

The phase correcting section 804 conducts the phase correction on the imaging echoes. The phase correcting section 804 corresponds to the function of the present apparatus described at Step 709 shown in FIG. 8. The phase correcting section 804 is an embodiment of the first correcting means of the present invention.

The intermediate image producing section 806 conducts the intermediate image production based on the phase-corrected imaging echoes. The intermediate image producing section 806 corresponds to the function of the present apparatus described at Step 711 shown in FIG. 8. The intermediate image producing section 806 is an embodiment of the first image producing means of the present invention.

The sensitivity matrix generating section 808 conducts the sensitivity matrix generation. The sensitivity matrix generating section 808 corresponds to the functions of the present apparatus described at Steps 701 and 703 shown in FIG. 8. The sensitivity matrix generating section 808 is an embodiment of the generating means of the present invention.

Figure 11:
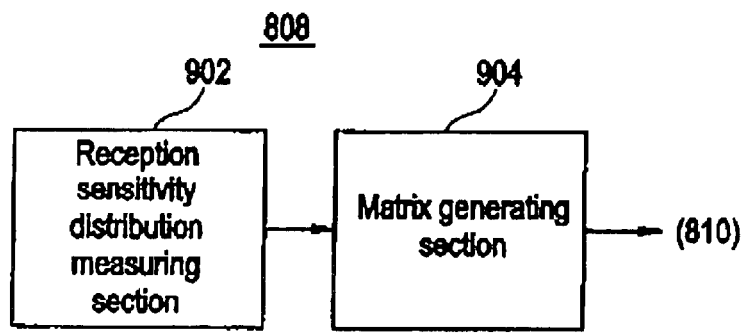
FIG. 11 is a functional block diagram of the apparatus in accordance with one embodiment of the present invention.

The sensitivity matrix generating section 808 is comprised of a reception sensitivity distribution measuring section 902 and a matrix generating section 904 as shown in FIG. 11. The reception sensitivity distribution measuring section 902 corresponds to the function of the present apparatus described at Step 701 shown in FIG. 8. The matrix generating section 904 corresponds to the function of the present apparatus described at Step 703 shown in FIG. 8.

The phase correcting section 810 conducts the phase correction on the sensitivity matrix. The phase correcting section 810 corresponds to the function of the present apparatus described at Step 705 shown in FIG. 8 or Step 705' shown in FIG. 9. The phase correcting section 810 is an embodiment of the second correcting means of the present invention.

The output image producing section 812 conducts the output image production using the intermediate image and sensitivity matrix. The output image producing section 812 corresponds to the function of the present apparatus described at Step 713 shown in FIG. 8. The output image producing section 812 is an embodiment of the second image producing means of the present invention.

Figure 12:
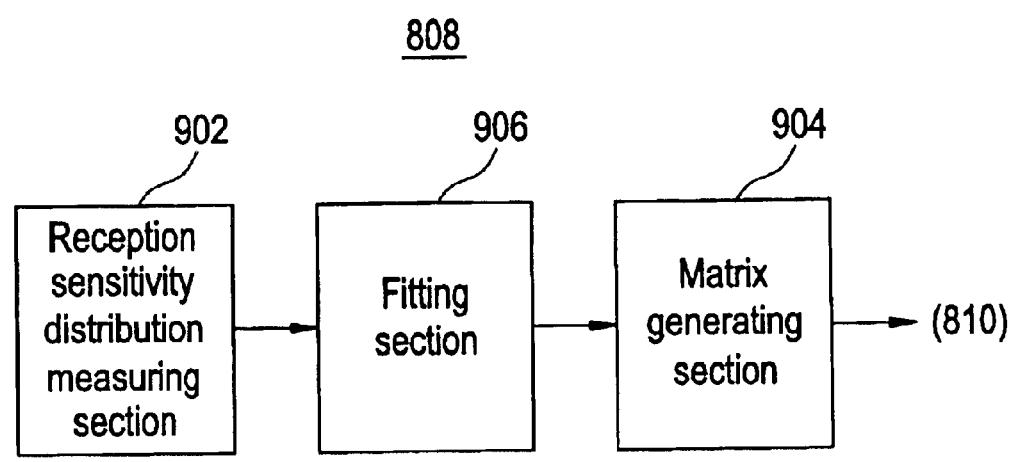
FIG. 12 is a functional block diagram of the apparatus in accordance with one embodiment of the present invention.

The sensitivity matrix generating section 808 may comprise a fitting section 906 between the reception sensitivity distribution measuring section 902 and matrix generating section 904 as shown in FIG. 12.

The fitting section 906 conducts functional fitting on the magnitude in the sensitivity maps obtained by the reception sensitivity distribution measuring section 902. In the fitting, the phases are preferably corrected beforehand so that the fitting may be facilitated. This also achieves the phase correction on the sensitivity matrix.

The function used in the fitting is a two-dimensional polynomial. The polynomial is preferably quadratic so that the order is small and the fitting is simplified. However, the order may be high, such as an order of three or greater.

The fitting in the case of an order of two is achieved by calculating coefficients a–f of the following two-dimensional quadratic polynomial by a method of least squares:

$$M=ax^2+by^2+cx+dy+exy+f \qquad \text{[Equation 12]}$$

At that time, the square error is preferably weighted according to the magnitude of the sensitivity maps so that an effect of noise on the fitting is mitigated. Fitting with higher accuracy can be achieved by setting the weight to the square of the magnitude.

Since the sensitivity maps can be mathematically expressed by the fitting, the output image can be produced using the sensitivity matrix S without a large error even if positional shifting of the pixels occurs between the calibration scan image (sensitivity maps) and the actually scanned image (intermediate image) due to the motion of the subject 1 or the like. That is, parallel imaging less affected by motion can be achieved.

The reason of this is that, by using the mathematical expression, it is possible to continuously extrapolate the sensitivity value not only for an exact pixel position but for proximate pixel positions, and therefore, a sensitivity value having high correctness can be obtained even if the pixel position is shifted.

Moreover, in general, fitting including the phase is difficult because receiver systems (coils) in a phased-array coil have different phase characteristics; however, the phase of the sensitivity matrix is homogenized in the present invention and the phase may be regarded as having been fitted in a sense, and therefore, exact fitting of the sensitivity matrix is possible.

Parallel imaging involving navigator echo collection is not limited to the MS-DW-EPI. Parallel imaging involving navigator echo collection may include, besides the MS-DW-EPI, imaging according to a three-dimensional gradient echo technique, for example.

FIG. 13 shows a pulse sequence of the technique. In FIG. 13, (1) shows a sequence of an RF pulse. (2)–(4) show pulse sequences of gradient magnetic fields. (2) represents a slice gradient and a phase encoding gradient in the slice direction, (3) represents a frequency encoding gradient, and (4) represents a phase encoding gradient. It should be noted that the static magnetic field is constantly applied at a fixed magnetic field strength.

First, spin excitation is effected by an $\alpha°$ pulse. The $\alpha°$ excitation is selective excitation under a slice gradient $G_{slice}$. After the $\alpha°$ excitation, a phase encoding gradient $G_{slice}$ in the slice direction, a frequency encoding gradient $G_{freq}$ and a phase encoding gradient $G_{phase}$ are applied in a predefined sequence and an imaging echo is read.

After reading the imaging echo, the phase encoding gradient $G_{slice}$ in the slice direction and phase encoding gradient $G_{phase}$ are rewound. Thereafter, a frequency encoding gradient $G_{freq}$ is solely applied to read a navigator echo.

Such a pulse sequence is repeated a predetermined number of times in a cycle of a repetition time TR, and an imaging echo and a navigator echo are read for each repetition. The phase encoding for the imaging echo is changed for each repetition, and imaging echoes filling one screen image are acquired in the predetermined number of repetitions. The imaging echo in each repetition is phase-collected by a navigator echo in the same repetition.

By reading the imaging echo using the phase encodings in two directions and the frequency encoding, data in a three-dimensional k-space are sampled. By increasing the sampling intervals, the data are collected with a three-dimensional reduced FOV.

By performing three-dimensional inverse Fourier transformation on the data, a three-dimensional image is reconstructed. The three-dimensional image is an intermediate image with the reduced FOV. From the intermediate image, an output image is produced with a full FOV using a sensitivity matrix S. It should be noted that the sensitivity matrix used is of a three-dimensional type.

In imaging the abdomen, body motion becomes an issue that makes a calibration scan and an actual scan susceptible to positional shifting; however, according to the present invention, parallel imaging can be achieved unaffected by such positional shifting.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus comprising:
an exciting and acquisition device configured to excite spins within a subject;
a plurality of parallel receiver systems configured to acquire, by applying a reduced field-of-view, imaging echoes generated by the excited spins along with navigator echoes;
a first correcting device configured to conduct phase correction on said imaging echoes based on at least one of said navigator echoes;
a first image producing device configured to produce an intermediate image based on said phase-corrected imaging echoes from said plurality of parallel receiver systems;
a separate generating device configured to generate a sensitivity matrix corresponding to and from said plurality of parallel receiver systems;
a second correcting device configured to phase-correct matrix data in said sensitivity matrix; and
a second image producing device configured to produce an output image with a full field-of-view based on said intermediate image and said phase corrected sensitivity matrix.

2. The magnetic resonance imaging apparatus of claim 1, wherein a reduction factor corresponding to said reduced field-of-view satisfies $n \geq R > 1$, wherein R is the reduction factor, and n is a number of said parallel receiver systems.

3. The magnetic resonance imaging apparatus of claim 1, wherein said exciting and acquisition device implements said reduced field-of-view by enlargement of sampling intervals represented in a k-space.

4. The magnetic resonance imaging apparatus of claim 3, wherein said exciting and acquisition device implements said enlargement of the sampling intervals by enlargement of a step difference of phase encoding.

5. The magnetic resonance imaging apparatus of claim 1, wherein said plurality of parallel receiver systems have respective receiving coils.

6. The magnetic resonance imaging apparatus of claim 5, wherein said receiving coils are surface coils.

7. The magnetic resonance imaging apparatus of claim 1, wherein said acquiring device employs an MS-DW-EPI technique in acquiring said imaging echo.

8. The magnetic resonance imaging apparatus of claim 1, wherein said exciting and acquisition device employs a technique other than a multi-shot diffusion-weighted echo planar imaging technique in acquiring said imaging echoes.

9. The magnetic resonance imaging apparatus of claim 1, wherein said generating device generates said sensitivity matrix based on a spatial distribution of reception sensitivity of said plurality of parallel receive systems with respect to the full field-of-view.

10. The magnetic resonance imaging apparatus of claim 9, wherein said generating device generates said sensitivity matrix after fitting the spatial distribution of a magnitude of the reception sensitivity of each of said plurality of parallel receiver systems to a two-dimensional polynomial.

11. The magnetic resonance imaging apparatus of claim 10, wherein said generating device conducts said fitting by applying a method of least squares including applying a weight that depends upon the magnitude of the reception sensitivity.

12. The magnetic resonance imaging apparatus of claim 11, wherein the weight is a square of the magnitude of the reception sensitivity.

13. The magnetic resonance imaging apparatus of claim 10, wherein
said two-dimensional polynomial is a quadratic.

14. The magnetic resonance imaging apparatus of claim 1, wherein said second correcting device homogenizes a phase.

15. The magnetic resonance imaging apparatus of claim 1, wherein said second correcting device sets a phase to zero.

16. The magnetic resonance imaging apparatus of claim 1, wherein said second correcting device sets a phase to a constant value other than zero.

17. The magnetic resonance imaging apparatus of claim 1, wherein said second image producing device employs an equation $V=(S^*S)^{31\ 1} S^* A$ in producing said output image, wherein V represents pixel values of the output image with the full field-of-view, S represents the sensitivity matrix, S* represents an adjoint matrix of S, and A represents pixel values of the intermediate image.

* * * * *

UNITED STATES PATENT AND TRADEMARK OFFICE
CERTIFICATE OF CORRECTION

PATENT NO. : 6,842,001 B2  Page 1 of 1
APPLICATION NO. : 10/642935
DATED : January 11, 2005
INVENTOR(S) : Ikezaki et al.

It is certified that error appears in the above-identified patent and that said Letters Patent is hereby corrected as shown below:

In Claim 7, column 14, line 19, delete "imaging echo" insert therefor -- imaging echoes --.

In Claim 7, column 14, line 18, delete "MS-DW-EPI" and insert therefore -- multi-shot diffusion-weighted echo planar imaging --.

In Claim 9, column 14, line 27, delete "receive" insert therefor -- receiver --.

In Claim 17, column 14, line 55, delete "$V=(S*S)^{31\ 1} S*\ A$" insert therefor -- $V=(S*S)^{-1} S*\ A$ --.

Signed and Sealed this

Sixth Day of February, 2007

JON W. DUDAS
*Director of the United States Patent and Trademark Office*